INVENTOR.
RICHARD B. NELSON
BY
ATTORNEY

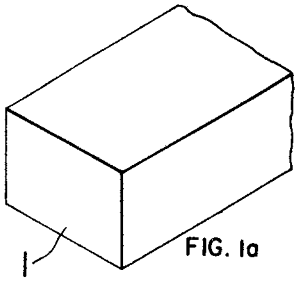
FIG. Ia
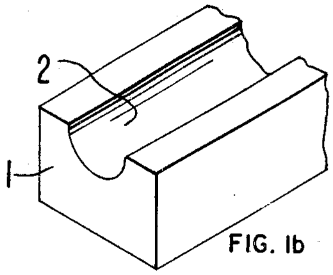
FIG. Ib
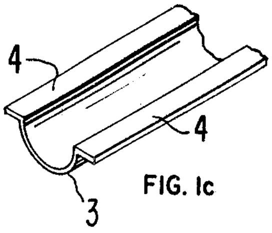
FIG. Ic
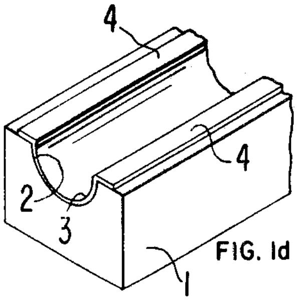
FIG. Id
FIG. Ie
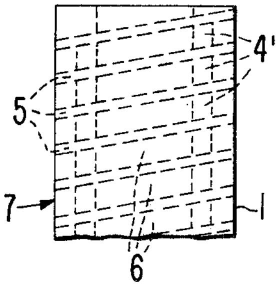
FIG. If
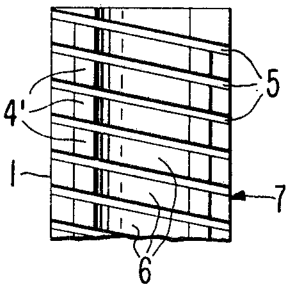
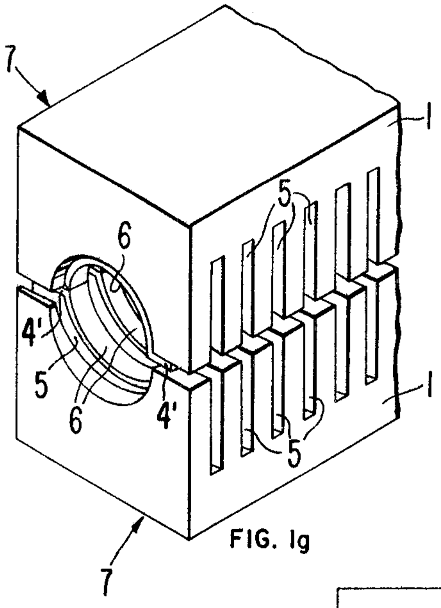
FIG. Ig
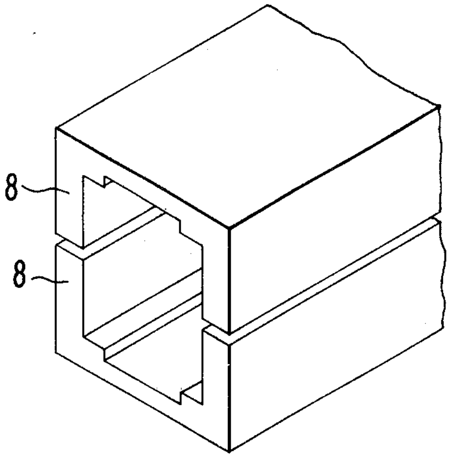
FIG. Ih
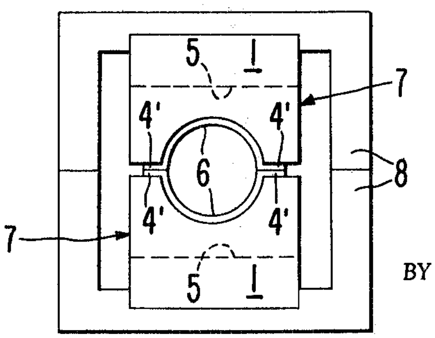
FIG. Ii
INVENTOR.
RICHARD B. NELSON
BY
Wm. J. Nolan
ATTORNEY

FIG.

INVENTOR.
RICHARD B. NELSON

BY

ATTORNEY

INVENTOR.
RICHARD B. NELSON
BY
ATTORNEY

United States Patent Office 3,505,730

Patented Apr. 14, 1970

3,505,730

MICROWAVE TUBES EMPLOYING CERAMIC COMB SUPPORTED HELIX DERIVED SLOW WAVE CIRCUITS AND METHODS OF FABRICATING SAME

Richard B. Nelson, Los Altos, Calif., assignor to Varian Associates, Palo Alto, Calif., a corporation of California Filed Jan. 16, 1967, Ser. No. 609,522
Int. Cl. H01p *11/00*
U.S. Cl. 29—600 9 Claims

ABSTRACT OF THE DISCLOSURE

Methods for fabricating ceramic comb supported helix derived slow wave circuits are described wherein a conductive member is bonded to a ceramic rod structure. The bonded unit is then slotted with an array of slots. The slots are arranged in certain patterns and pass through certain portions of the conductive member and partially through the ceramic rod to produce at least a portion of a helix derived slow wave circuit with an array of ceramic fingers bonded thereto and supporting same. In certain embodiments, a complete comb supported slow wave circuit is formed by bonding two or more of such slotted ceramic and metal structures together. In one embodiment, two or more bonded ceramic and metal structures form a surrounding barrel structure forming a central ceramic portion of the vacuum envelope of a microwave tube. In another embodiment, two or more slotted metal and ceramic structures are bonded to a surrounding metallic barrel structure which forms the central vacuum envelope of the microwave tube.

CROSS-REFERENCES TO RELATED APPLICATIONS

Copending U.S. application of Fredrick L. Salisbury 609,521, filed Jan. 16, 1967 and assigned to the same assignee as that of the present invention described and claims ceramic comb supported helix derived slow wave circuits for microwave tubes. In that application, the circuit is fabricated by slotting the ceramic rod and brazing same to a preformed slow wave circuit. In another copending application of Norman R. Vanderplaats, U.S. 609,466, filed Jan. 16, 1967 and assigned to the same assignee as that of the present invention, ceramic comb supported ring-and-bar slow wave circuits are described and claimed wherein the fingers of the comb structures are connected only to the interconnecting bar portions of the slow wave circuit.

DESCRIPTION OF THE PRIOR ART

Heretofore, it has been proposed to support helix derived slow wave circuits such as helices, ring-and-bar circuits and doubly connected ring-and-bar circuits by a surrounding ceramic structure with the circuit being formed on the surface of a bore passing through the ceramic structure. The problem with this type of support is that it adds too much capacitive loading between adjacent turns of the helix derived circuit, thereby excessively reducing the electronic interaction of the circuit with a beam passable therethrough.

It has also been proposed to avoid the capacitive loading problem by supporting the circuit on an array of ceramic rings coaxially disposed of the circuit and interposed between the circuit and a surrounding barrel structure. The problem with this arrangement is that it is extremely difficult to fabricate for circuits operating at high microwave frequencies. For example, at Ku band the rings are only 0.015" wide. Such rings become fragile, difficult to handle for brazing and assembly and are easily fractured by thermal stress produced during brazing and in use.

BRIEF SUMMARY OF THE INVENTION

The principal object of the present invention is the provision of improved microwave tubes and methods of fabricating same.

One feature of the present invention is the provision of an improved method for fabricating ceramic comb supported helix derived slow wave circuits for microwave tubes wherein a ceramic insulator body is bonded to the outer periphery of a conductive member which will form at least a segment of the slow wave circuit, an array of slots are then cut through the conductive member and at least partially through the ceramic body. The slots are cut according to a certain predetermined pattern to form at least a portion of a slow wave circuit supported upon the ends of an array of ceramic finger portions of a comb structure. In this manner, critical dimensions of the circuit and support structure are determined by a simple and easily controlled machining operation, thereby facilitating automation and eliminating circuit alignment problems. Moreover, essentially the entire metal slow wave circuit is in thermal contact with the ceramic supporting structure to facilitate mechanical support and cooling of the circuit.

Another feature of the present invention is the same as the preceding feature wherein two or more of such slotted metal and ceramic structures are bonded together to form a complete slow wave circuit.

Another feature of the present invention is the same as any one or more of the preceding features wherein two or more of such slotted metal and ceramic structures are bonded together with the ceramic members forming a central portion of the vacuum envelope of the microwave tube.

Another feature of the present invention is that two or more of the slotted metal and ceramic structures are bonded to a surrounding metallic barrel which barrel forms the central portion of the tube vacuum envelope.

Another feature of the present invention is the same as any one or more of the preceding features wherein fluid coolant passages are formed as an integral part of the metal and ceramic comb structures for cooling of the slow wave circuit.

Other features and advantages of the present invention will become apparent upon a perusal of the following specification taken in connection with the accompanying drawings.

BRIEF DESCRIPTION OF THE DRAWINGS

FIGS. 1(*a*)–(*h*) depicts a method for fabricating a helical slow wave circuit of the present invention, FIGS. 2(*a*)–(*f*) depicts a method for fabricating a helix derived ring-and-bar slow wave circuit, FIGS. 3(*a*)–(*c*) depicts an alternative method for fabricating a ring-and-bar slow wave circuit, FIGS. 4(*a*)–(*e*) depicts a method for fabricating a helix derived doubly connected ring-and-bar circuit.

Referring now to FIG. 1, there is depicted a method of the present invention for fabricating ceramic comb supported helix slow wave circuits for microwave tubes. More specifically, a ceramic insulator rod 1, as of alumina or preferably beryllia, is formed with a longitudinally directed semi-cylindrical trough 2 having a radius of curvature conforming to the outside radius of curvature of the helix slow wave circuit to be fabricated. A metal sheet 3, as of copper or molybdenum, which is to form the slow wave circuit is formed at (*c*) to conform to the trough 2. The sheet 3 is bonded, as by brazing, to the trough surface 2. The sheet 3 is formed with lips 4 which are bonded to the marginal edges of the trough 2. As an alternative, the thin metal sheet 3 may be plated directly on the trough surface 2 as by vapor deposition, electroplating, metallizing, vacuum evaporation, sputtering, or combination thereof. Such plated metal sheet is thereby bonded to the ceramic insulator. The thickness of the sheet 3 depends upon the operating frequency and power level of the tube. At Ku band a suitable thickness is 0.0055″. The bottom surface of the insulator rod is also metallized.

Figure 2A:
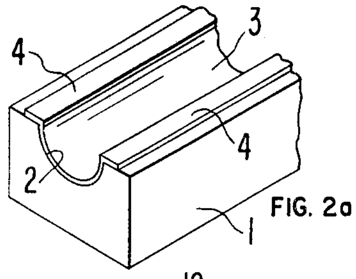
Figure 2B:
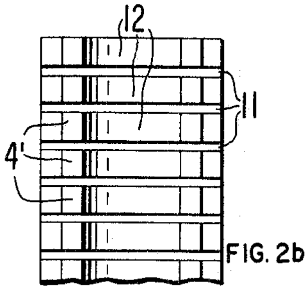
Figure 2C:
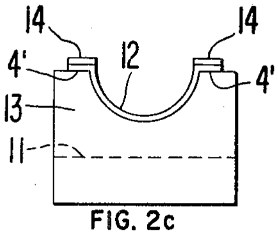
Figure 2D:
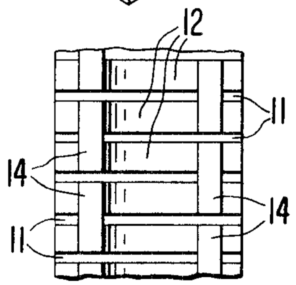
Figure 2E:
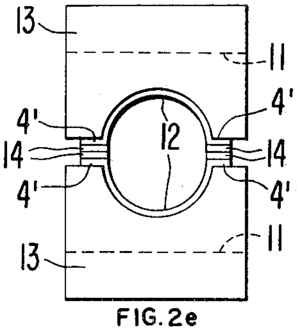
Figure 2F:
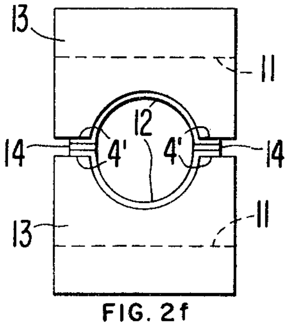
Figure 3A:
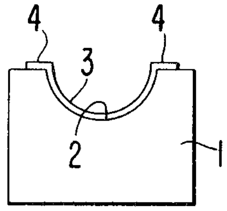
Figure 3B:
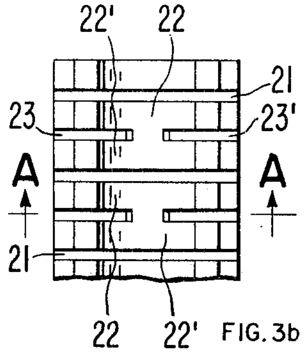
Figure 3C:
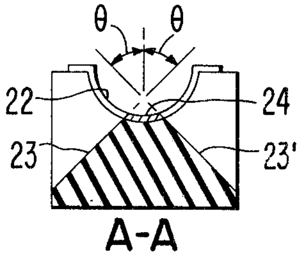
Figure 3D:
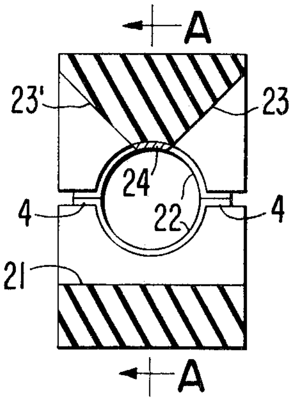
Figure 3E:
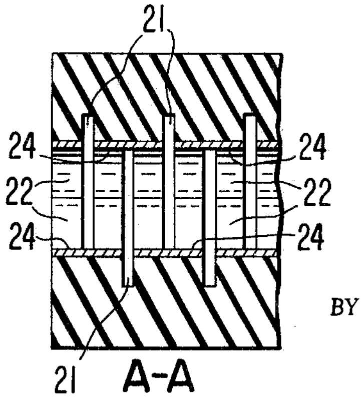
Figure 4A:
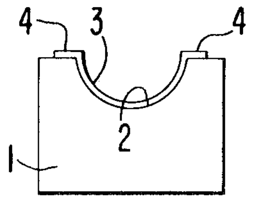
Figure 4B:
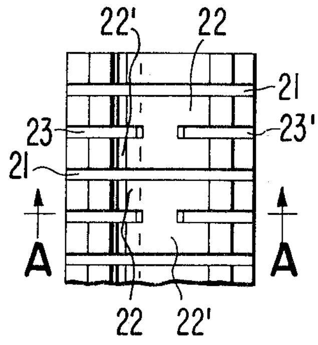
Figure 4C:
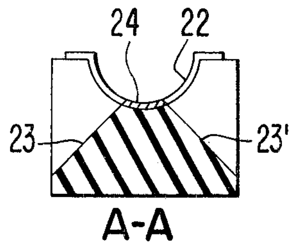
Figure 4D:
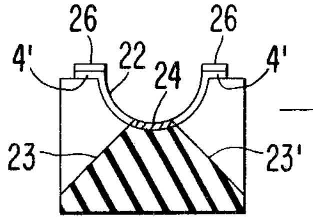
Figure 4E:
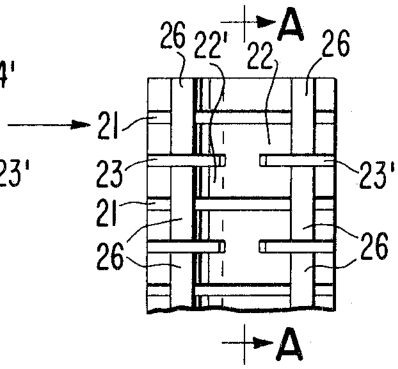
Figure 4F:
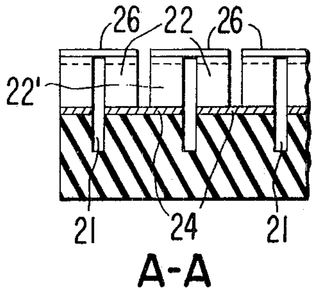
Figure 4G:
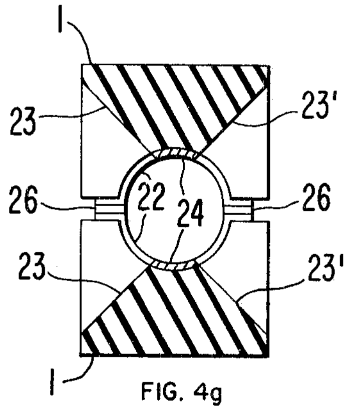

The composite metal and ceramic body is then slotted at (*e*) with an array of slots 5 diagonally traversing the ceramic body 1. The slots sever the metal sheet 3 and pass partially through the thickness of the ceramic rod 1. The axial spacing of the slots 5 is equal to the pitch of the helix to be formed, and the axial displacement between the ends of a slot is ½ of the pitch. The slots 5 are conveniently cut by a dicing machine using an abrasive slurry and a reciprocating blade or gang of blades. Alternatively, other types of machines may be used such as, for example, a grinder using diamond loaded wheels or the combination of a grinder and an electric discharge machine.

Two such metal-ceramic rods 1 are slotted as shown at (*e*). The array of slots forms an array of semi-cylindrical helix or loop segments forming a half circuit bonded at their outer surfaces to the ends of an array of ceramic finger portions of a ceramic comb structure 7.

Two of these ceramic comb structures are then put together at (*f*) with the tabs 4′ on the ends of the metal loop segments 6 in registration and with a strip of brazing alloy between the opposed tabs 4′. The assembled comb structures form a helical slow wave circuit which is in good thermal contact with and mechanically supported from the fingers of the ceramic comb structures.

In these comb structures 7, the ceramic material is removed from the spaces between adjacent turns of the helix so that the helix circuit is not unduly capacitively loaded, thereby maintaining its electronic impedance while not adversely affecting the thermal capabilities of the circuit.

Two semi-tubular envelope sections 8 as of 65% by volume of porous tungsten infiltrated with 35% by volume of copper are fabricated at (*g*) and assembled with the preassembled comb structure 7 as shown in (*h*). The unit is then brazed together to form the central body portion of a microwave tube.

The purposes of the tabs 4′ are to give a large enough area for a good braze, to raise the braze area so it is certain to be in contact, and to allow for external inspection of the brazed joints. During the brazing operation, the brazing alloy melts and is drawn into the metal joints. The alloy does not wet the ceramic in the slots between adjacent turns of the resultant helix. Alternately, the raised tabs may be selectively coated with brazing alloy, as by silk screen printing of alloy in paste form.

Some of the advantages of fabricating a helix slow wave circuit as described with regard to FIG. 1 are; that the metal-to-ceramic bonds required in the slow wave circuit are made on a few large pieces rather than on a myriad of small pieces; that the circuit and support structure are simultaneously machined thereby avoiding a tedious and precise alignment problem; that the critical dimensions of the circuit and its support structure are determined by a machining operation, thereby permitting use of automatic machinery for tube fabrication; that the brazed joints are inspectable because they are formed along the outside edge of the comb structures; and that essentially the entire metal circuit is in good thermal contact with the cooling ceramic structure.

Referring now to FIG. 2, there is depicted a method for fabricating helix derived ring-and-bar slow wave circuits. A semi-cylindrical sheet of metal is formed in the trough portion 2 of a ceramic rod 1, as described previously with regard to FIG. 1. Then at (*b*) the composite metal-and-ceramic structure is slotted by an array of transversely directed slots 11 to form an array of semicircular ring segments 12 bonded at their outer surfaces to the ends of an array of ceramic fingers 13. At (*c*) a pair of conductive bars 14 which extend the full length of the rod 1 are brazed over the marginal tab portions 4′ of the ring segments 12. Then, at (*d*) the bars 14 are severed by slotting through each bar 14 at every other slot 11 on each side of the circuit and in a pattern which alternates the severe point from one bar to the other as the circuit advances from one ring 12 to the next. This slotting operation is conveniently performed by mounting the structure of 2(*c*) in a tilted relation in a grinder such that only one bar 14 is severed on a pass of the grinder through the slots of the comb structures.

The circuit structure of FIG 2(*d*) is a complete half of a ring-and-bar circuit. Two of these half-circuits are put together at (*e*) to form a complete ring-and-bar circuit. The circuits are assembled such that the bar segments are in registration. The two halves need not be brazed together nor even make physical contact, because there is no current flow across the plane of symmetry in the dominant electric mode of the circuit. In fact, the contact resistance is desirable because it will attenuate the currents in the undesired "antisymmetric" mode.

As an alternative, the complete circuit half of FIG. 2(*d*) may be put together with the comb structure of FIG. 2(*b*) which contains only an array of severed ring segments 12. In this case, the ring segments 12 are placed in registration and the two circuit halves are brazed together as shown at 2(f). The complete circuits of (*e*) or (*f*) are then brazed into a split envelope section 8 shown at FIG. 1(*h*).

Referring now to FIG. 3, there is shown an alternate method for fabricating the ring-and-bar circuit. The composite metal and ceramic structure, corresponding to that of FIG. 1(*d*), is fabricated as described previously with regard to FIG. 1. The structure is slotted at 3(*b*) with an array of transverse slots of two kinds, the slots alternating between the two kinds of slots as taken in the direction along the longitudinal axis of the ceramic rod 1. More particularly, a first type of slot 21 severs the conductive sheet 3 into ring segment 22 and forms finger portions of the ceramic rod 1 in the spacer between adjacent slots 21 of like kind. The ring segments 22 are bonded at their outer periphery to the ends of the fingers. The array of the second kind of slots 23 are interdigitated with the slots 21 of the first kind. The second slots 23 comprise two cuts 23 and 23′ inclined at angles $\theta$ to the vertical and cutting across the corners of the ceramic rod 1 toward the central portion of the rod. The inclined slot portions 23 and 23′ do not intersect at the bottom of the trough 2 such that a connecting bar 24 of metal is left between adjacent axially spaced semicircular ring segments 22 and 22′. The slotted structure forms one half-circuit portion of a ring-and-bar slow wave circuit.

Two of these half-circuits are brazed together at (*c*) with the bars 24 offset ½ period to form the complete periodic slow wave circuit. The slow wave circuit with its comb support structure may be brazed into a tubular vacuum envelope section as described previously with regard to FIG. 1(*h*). One of the advantages of the ring-and-bar circuit of FIG. 3 is that absolutely all of the metal conductors of the slow wave circuit, i.e., all the rings and all the bars are in intimate contact with the ceramic. Thus, the metal parts can be made very thin.

Referring now to FIG. 4, there is shown a method for fabricating a doubly connected ring and bar comb supported slow wave circuit. The first two steps of this method, namely steps (*a*) and (*b*), are identical to steps (*a*) and (*b*) of the method of FIG. 3. However, in the next step, step (*c*), a pair of conductive bars 26 are brazed over the tab portions 4' and along the marginal edge of the trough 2. These bars 26 are then slotted, in step (*d*), by an array of slots corresponding to the inclined slots 23 and 23' to sever the bars 26 at slots 23 while leaving the bars intact to bridge across slots 21. This produces a half-circuit. Two such half circuits are put together with the bars 26 in registration to define a complete doubly connected ring-and-bar circuit. In such a circuit, the two half circuits need not make physical or electrical contact at the registered bar portions 26.

As an alternative to use of two half-circuits as shown in FIG. 4(*d*), one half-circuit of FIG. 4(*d*) may be brazed together with one half circuit of FIG. 4(*b*) to form the composite doubly connected ring-and-bar circuit. Such a composite circuit is depicted at FIG. 4(*e*).

Figure 5:
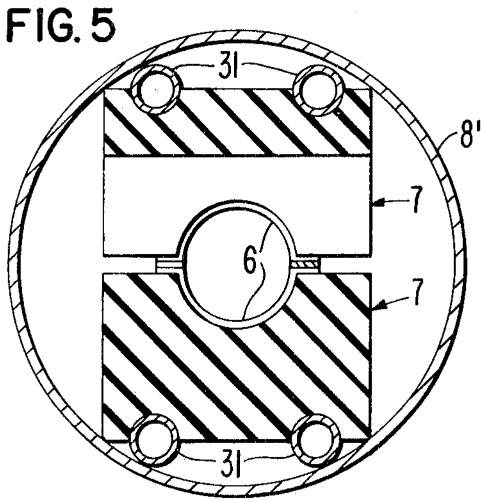
FIGS. 5 and 6 are transverse sectional views of helix derived slow wave circuits showing alternative fluid coolant passageways.
Figure 6:
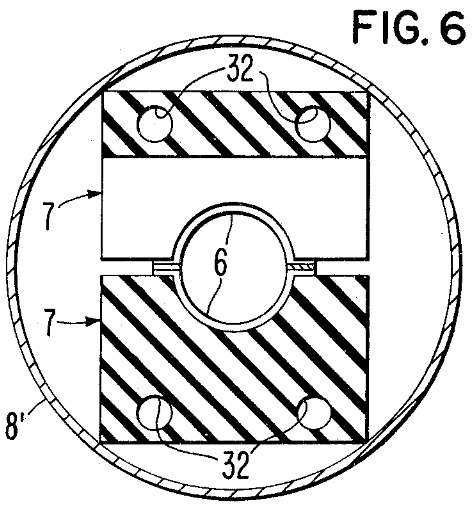

Referring now to FIG. 5, there is shown a transverse sectional view of a comb supported slow wave circuit. The structure is essentially equivalent to that of FIG. 1(*h*) except that the surrounding envelope structure 8 is a cylindrical tube 8' and coolant pipes 31 are brazed directly to the ceramic spine of the ceramic comb support structure 7. A liquid coolant, such as water, is circulated through the pipes 31 for removing heat from the ceramic structures 7. The coolant pipes preferably are made of a material having the same coefficient of linear thermal expansion as that of the ceramic. Suitable materials include niobium or the porous tungsten copper filled material, described previously. FIG. 6 shows an alternative structure wherein the coolant passageways 32 are formed directly in the ceramic spine portion of the comb structures 7.

Figure 7:
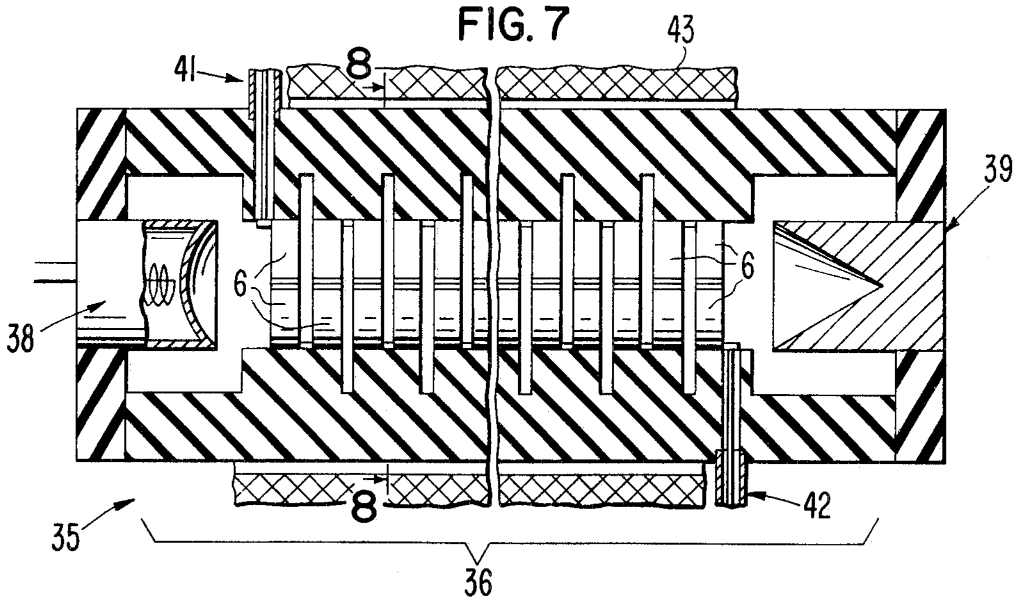
FIG. 7 is a longitudinal sectional view of a microwave tube of the present invention.
Figure 8:
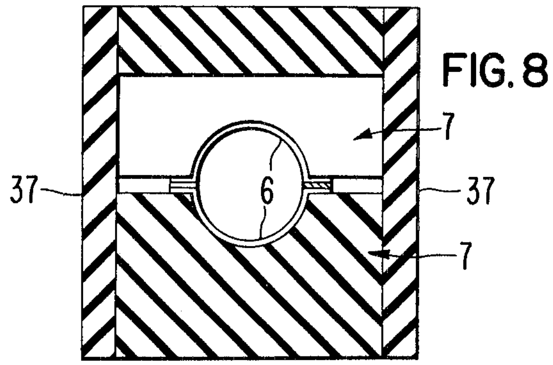
FIG. 8 is a sectional view of a portion of the structure of FIG. 7 taken along line 8–8 in the direction of the arrows.

Referring now to FIGS. 7 and 8, there is shown a microwave traveling wave tube 35 incorporating features of the present invention. More specifically, the central body portion 36 of the tube 35 is formed by a pair of the ceramic comb structurtes 7 closed at their sides by a pair of metal or ceramic plates 37. The plates 37 are conveniently brazed to the ceramic combs 7. The ends of the central body portion 36 are closed at one end by an electron gun assembly 38 and at the other end by a beam collector structure 39. An input coupler 41 couples R.F. energy to be amplified onto the slow wave structure 6. An output coaxial coupler 42 couples the amplified R.F. energy off of the circuit 6 for application to a suitable load, not shown. An electrical solenoid 43 coaxially surrounds the central body portion 36 for producing an axially directed magnetic field over the beam path through the circuit 6 between the gun 38 and the collector 39 for focusing the beam. The ceramic envelope 35 is preferably covered with a thin deposit of metal such as cooper to act as an electrical shield. The various feed-through insulators are conveniently formed by selectively removing portions of the metal covering layer.

Since many changes could be made in the above construction and many apparently widely different embodiments of this invention could be made without departing from the scope thereof, it is intended that all matter contained in the above description or shown in the acompanying drawings shall be interpreted as illustrative and not in a limiting sense.

What is claimed is:

1. The method of fabricating a ceramic comb supported helix derived slow wave circuit for microwave tubes comprising the step of, forming a curving trough in a ceramic insulator body, forming a sheet-like layer of metal on and bonded to said curved trough surface of said insulator body, and slotting through the metallic sheet and at least partially through the ceramic insulator body with an array of slots in a predetermined pattern to form a portion of a periodic helix derived slow wave circuit supported from and bonded to an array of ceramic finger portions of the ceramic insulator body, such fingers being defined by the ceramic material remaining between adjacent slots.

2. The method of claim 1 wherein the step of forming the sheet-like layer on the ceramic insulator comprises the step of plating a layer of conductive material onto the surface of the insulator body, such plating forming a bond to the insulator.

3. The method of claim 1 wherein the step of forming the layer of metal on the insulator body comprises the step of bonding a conductive metal sheet to the insulator body.

4. The method of claim 1 including the step of forming a fluid coolant passageway along and contiguous to the ceramic insulator body.

5. The method of claim 1 wherein the slotting step produces an array of slots transversely directed of the curved trough in the insulator body.

6. The method of claim 1 wherein the slotting step produces an array of slots transversely directed of the curved trough in the insulator body to form an array of conductive ring segments including the step of bonding a pair of conductive bars along both side edges of the array of ring segments, and severing the bars between every other ring on each side of the array of ring segments with the points of sever alternating from ring to ring from one side to the array of ring segments to the other side, whereby a portion of a comb supported ring and bar circuit is formed.

7. The method of claim 1 wherein the insulator body is elongated and the array of slots is transversely directed of the curved trough in the insulator body with every other slot of the array only partially severing the conductor to leave a conductive bar portion between certain ones of the ring segments of the array, such bars forming connecting bar portions of a ring-and-bar slow wave circuit.

8. The method of fabricating a ceramic comb supported helix derived slow wave circuit for microwave tubes comprising the steps of, forming sheet-like layers of metal on at least two ceramic insulator bodies, such sheet-like layers being bonded to said insulator bodies, slotting through the metallic sheet-like layers and at least partially through said insulator bodies to form an array of slots in a predetermined pattern to form portions of a periodic helix derived slow wave circuit supported from and bonded to an array of ceramic finger portions of the ceramic insulator bodies, such fingers being defined by the ceramic material remaining between adjacent slots, and bonding the slotted composite metal-ceramic bodies into a composite assembly to form the helix derived slow wave circuit.

9. The method of claim 8 wherein the insulator bodies form a portion of the vacuum tight envelop microwave tube structure.

References Cited

UNITED STATES PATENTS

| | | | |
|---|---|---|---|
| 2,381,463 | 8/1945 | Potter | 29—607 |
| 2,812,499 | 11/1957 | Robertson | 29—600 |
| 2,942,142 | 6/1960 | Dench | 313—3.5 |
| 3,017,687 | 1/1962 | Day | 29—25.18 |
| 3,243,735 | 3/1966 | Gross. | |
| 3,259,559 | 7/1966 | Schneble et al. | |

FOREIGN PATENTS

| | | |
|---|---|---|
| 620,228 | 5/1961 | Canada. |

JOHN F. CAMPBELL, Primary Examiner

R. B. LAZARUS, Assistant Examiner

U.S. Cl. X.R.

29—481; 333—95